(12) United States Patent
Shafer

(10) Patent No.: US 6,262,826 B1
(45) Date of Patent: *Jul. 17, 2001

(54) REFLECTIVE OPTICAL IMAGING METHOD AND CIRCUIT

(75) Inventor: David R. Shafer, Fairfield, CT (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/477,765

(22) Filed: Jan. 4, 2000

Related U.S. Application Data

(62) Division of application No. 09/027,282, filed on Feb. 20, 1998, now Pat. No. 6,014,252.

(51) Int. Cl.⁷ .................................................. G02B 26/08
(52) U.S. Cl. ........................ 359/208; 359/205; 359/729; 359/731; 359/900
(58) Field of Search ..................... 359/205, 208, 359/350, 355, 365, 366, 729–731, 727, 858, 859, 861, 351, 900; 378/34, 35

(56) References Cited

U.S. PATENT DOCUMENTS

| | | | |
|---|---|---|---|
| 5,063,586 | 11/1991 | Jewell et al. | 378/34 |
| 5,153,898 | 10/1992 | Suzuki et al. | 378/34 |
| 5,212,588 | 5/1993 | Viswanathan et al. | 359/355 |
| 5,220,590 | 6/1993 | Bruning et al. | 378/34 |
| 5,315,629 | 5/1994 | Jewell et al. | 378/34 |
| 5,353,322 | 10/1994 | Bruning et al. | 378/34 |
| 5,410,434 | 4/1995 | Shafer | 359/858 |
| 5,973,826 | * 10/1999 | Chapman et al. | 359/355 |
| 6,014,252 | * 1/2000 | Shafer | 359/355 |

FOREIGN PATENT DOCUMENTS 0779528   11/1996   (EP) .

OTHER PUBLICATIONS

"Design of reflective relay for soft x–ray lithography" by Rodgers et al.; SPIE vol. 1354, International Lens Design Conference (1990). (No month).

"Reflective systems design study for soft x–ray projection lithography" by Jewell et al.; J. Vac. Sci. Technol. B 8 (6) Nov./Dec. 1990.

"Optical system design issues in development of projection camera for EUV lithography" by Jewell; SPIE vol. 2437 May 1995.

* cited by examiner

Primary Examiner—James Phan
(74) Attorney, Agent, or Firm—Alan H. Thompson

(57) ABSTRACT

An optical system compatible with short wavelength (extreme ultraviolet) radiation comprising four reflective elements for projecting a mask image onto a substrate. The four optical elements are characterized in order from object to image as convex, concave, convex and concave mirrors. The optical system is particularly suited for step and scan lithography methods. The invention increases the slit dimensions associated with ringfield scanning optics, improves wafer throughput and allows higher semiconductor device density.

9 Claims, 5 Drawing Sheets

REFLECTIVE OPTICAL IMAGING METHOD AND CIRCUIT

This is a Division of application Ser. No. 09/027,282 filed Feb. 20, 1998, U.S. Pat. No. 6,014,252.

The United States Government has rights in this invention pursuant to Contract No. W-7405-ENG-48 between the U.S. Department of Energy and the University of California, for the operation of Lawrence Livermore National Laboratory.

BACKGROUND OF THE INVENTION

1. Field of the Invention

This invention is related to an optical system for use with short wavelength radiation in photolithography equipment.

2. Background of the Invention

Photolithography is a well known manufacturing process used to create devices upon substrates. The process typically involves exposing a patterned mask to collimated radiation, producing patterned radiation, which is passed through an optical reduction system. The reduced patterned radiation or mask image is projected onto a substrate coated with photoresist. Radiation exposure changes the properties of the photoresist allowing subsequent processing.

Photolithography machines or steppers, use two common methods of projecting a mask image onto a substrate, "step and repeat" and "step and scan". The step and repeat method sequentially exposes portions of a substrate to a mask image. The step and repeat optical system has a projection field which is large enough to project the entire mask image onto the substrate. After each image exposure, the substrate is repositioned and the process is repeated.

In contrast, the step and scan method in contrast scans a mask image onto a substrate through a slit. Referring to FIG. 1, a ring field lithography system 100 for use in the step and scan method is shown. A moving mask 101 is illuminated by a radiation beam 103, which reflects off of the mask 101 and is directed through a reduction ring field optical system 107. Within the optical system 107 the image is reversed and a slit shaped reduced image beam 109 is projected onto a moving substrate 111. The slit shaped reduced image beam 109 can only project a portion of the mask 101, thus the image beam 109 must scan the complete mask 101 onto the substrate 111. Because the mask 101 and substrate 111 move synchronously, a sharp image is scanned onto the substrate 111. Once the complete mask 101 is scanned onto the substrate, the mask 101 and substrate 111 are repositioned and the process is repeated. The dimensions of the slit are typically described by a ring field radius and a ring field width.

As manufacturing methods improve, the minimum resolution dimension which can be achieved with reduced pattern radiation decreases allowing more electronic components to be fabricated within a given area of a substrate. The number of devices that can be fabricated within an area of substrate is known as device density. A common measure of device density is the amount of memory that can be fabricated on a single DRAM chip. The relationship between resolution dimension and DRAM memory size is shown in Table 1. With existing technology 0.25 µm resolution is possible.

TABLE 1

| Resolution Dimension | DRAM Memory Size |
|---|---|
| 0.30 µm | 16–64 Megabytes |
| 0.25 µm | 64–256 Megabytes |
| 0.18 µm | 1 Gigabyte |
| 0.13 µm | 4 Gigabyte |
| 0.10 µm | 16 Gigabyte |
| 0.07 µm | 64 Gigabyte |

One well-known means of improving the resolution dimension and increasing device density is to use shorter exposure wavelength radiation during photolithography processes. The relationship between resolution dimension and radiation wavelength is described in the formula: $R=(K_1\lambda)/(NA)$, wherein R is the resolution dimension, $K_1$ is a process dependent constant (typically 0.7), $\lambda$ is the wavelength of the radiation, and NA is the numerical aperture of the optical system projecting the mask image. Either reducing, or increasing the NA will improve the resolution of the system.

Improving the resolution by increasing the numerical aperture (NA) has several drawbacks. The most prevalent drawback is the concomitant loss in depth of focus with increased NA. The relationship between NA and depth of focus is described in the formula: $DOF=(K_2\lambda)/NA^2$, wherein DOF is depth of focus, and $K_2$ is a process dependent constant (typically close to unity). This simple relationship shows the inverse relationship between DOF and NA. For several reasons, including practical wafer flatness and scanning stage errors, a large depth of focus is on the order of ±1.0 micrometers is desirable.

Immediately, the shortcomings of resolution improvement via numerical aperture increase can be seen. As lithography technologies evolve toward shorter wavelengths, projection systems operate in different regions of wavelength-NA space. For EUV lithography at an operational wavelength of 13.4 nm, 0.1 µm resolution can be achieved with a projection system that has a numerical aperture of 0.10. This low numerical aperture affords a depth of focus of ±1 µm. In stark contrast, deep ultraviolet (DUV) lithography at 193 nm requires a projection system with a numerical aperture of 0.75 to achieve 0.18 µm features (assuming $K_1=0.7$). At this NA, the depth of focus has been reduced to ±0.34 µm. In addition, fabrication and assembly tolerances make it impractical to build optical systems with such as large NA.

As is known in the art, short $\lambda$ radiation (less than about 193 nm) is not compatible with many refractive lens materials due to the intrinsic bulk absorption. To reduce the radiation absorption within an optical system reflective elements may be used in place of refractive optical elements. State of the art DUV systems use catadioptric optical systems which comprise refractive lenses and mirrors. The mirrors provide the bulk of the optical power and the lenses are used as correctors to reduce the field dependent aberrations.

To produce devices with smaller resolution dimensions and higher 15 device density than is possible with DUV systems, optical systems compatible with even shorter wavelength radiation are required. Extreme ultraviolet (EUV) radiation ($\lambda$ less than about 15 nm) cannot be focused refractively. However, EUV radiation can be focused reflectively using optical elements with multilayer coatings.

Early EUV lithographic projection optical systems focused on the development of optical systems that project two dimensional image formats. One example of a step and repeat optical system is disclosed in U.S. Pat. No. 5,063,586. The '586 patent discloses coaxial and tilted/decentered configurations with aspheric mirrors which project approximately a 10 mm×10 mm image field. The '586 patent system achieves an acceptable resolution of approximately 0.25 µm across the field, but suffers from unacceptably high distortion, on the order of 0.7 µm. The '586 patent optical system is impractical because the mask would have to pre-distorted in order to compensate for the distortion.

More advanced step and scan optical systems have been developed due to the unacceptable distortion of the large image fields of step and repeat optical systems. Step and scan systems have less distortion than step and repeat systems because distortion can be corrected over the narrow slit width in the direction of scan. Step and scan optical systems typically utilize ring fields. Referring to FIG. 2, in a step and scan optical system an image is projected by the inventive optical system onto the wafer through an arcuate ring field slit 201 which is geometrically described by a ring field radius 203, a ring field width 205 and a length 207. Ring field coverage is unlimited in azimuth.

One example of a step and scan optical system is disclosed in U.S. Pat. No. 5,315,629. Although the '629 patent optical system has low distortion, the ring field slit width 205 is only 0.5 mm at the wafer. High chief ray angles make it difficult to widen the ring field width 205. The 0.5 mm width 205 of tie '629 patent limits the speed at which the wafer can be scanned, restricting throughput. The radius 203 of the '629 patent optical system ring field is 31.5 mm which does not cover a wide swath in the cross scan dimension, further reducing wafer throughput.

Another disadvantage of systems similar to the '629 patent optical system is that it may require the use of graded multilayer reflective coating optics as opposed to simpler uniform thickness multilayer coating optics. Uniform thickness multilayer coatings are generally not suitable for high incidence angles and a wide range of incidence angles. FIG. 3 illustrates the non-uniform reflectivity resulting from high and wide ranges of incidence angles against a uniform multilayer optical element. Beams 301 and 303 have incident angles of 10° and 15°, which correspond to reflectivities of 69% and 40%, respectively. The reflected intensity of reflected beam 309 is greater than the intensity of reflected beam 311 because the incidence angle of beam is in a higher reflectivity region than the incidence angle of beam 303. This difference in the resulting reflectivity creates a projected image with non-uniform intensity.

Referring again to FIG. 3, if a graded reflective coating is properly applied to optical element 305, the reflectivity at the incidence point of beam 301 is reduced so that the reflected beam 309 has an intensity equal to that of beam 311. Although graded reflective optics can address the intensity uniformity problem, graded reflective optics are nonetheless undesirable because they are difficult to fabricate and test.

Another example of a step and scan optical system is U.S. Pat. No. 5,353,322. The '322 patent discloses 3-mirror and 4-mirror optical systems. An extra mirror in the 4-mirror systems solves the optical system wafer/mask clearance problem but does not add any reflective power or provide any optical aberration correction. Another drawback of the '322 optical system is that its aperture stop is inaccessible. Because the aperture stop is inaccessible, the imaging bundle will change as the projected image crosses the ring field width.

There are a number of other prior art optical systems compatible with EUV wavelength radiation and use reflective optics. These prior art EUV optical systems typically use simple reflective optics which have spherical convex or spherical concave surfaces. The surface of a spherical reflective element is defined by a constant radius of curvature across the surface of the optic. A drawback of all spherical systems is that they can distort projected images by introducing unwanted aberrations (i.e. spherical, coma, astigmatism, Petzval curvature and distortion). These aberrations can be at least partially corrected or even eliminated by using aspheric mirrors.

In view of the foregoing, there is a need for an optimized optical system which is compatible with short wavelength radiation, has high radiation throughput, uses only uniform thickness multilayer reflective coating optics, uses only low aspheric reflective optics and has an accessible aperture stop.

SUMMARY OF THE INVENTION

The present invention is directed to a reflective optical system that addresses the above and other problems. More specifically, the present invention is a four mirror optical system which allows a reduced mask image to be projected onto a wafer with short wavelength radiation. The present invention allows higher device density because resolution is improved.

In this regard, the present invention also improves wafer throughput. The reflective optics have been configured to improve radiation throughput by improving optical element reflectivity. The optical elements have been configured with radiation beam incidence angles as close as possible to perpendicular. The acceptable ranges of incidence angles have also been minimized to preserve uniform reflectivity and to eliminate the need for graded optics, which can add significant risk and cost to the system. The inventive optical system further minimizes manufacturing costs by utilizing low aspheric optical elements which are significantly easier to fabricate than highly aspheric optical elements.

The present invention includes an accessible aperture stop which allows the inventive optical system's radiation output to be easily adjusted. The ability to control the output radiation can improve wafer throughput for a specific lithography process.

Other advantages and features of the present invention will become apparent from a reading of the following description when considered in conjunction with the accompanying drawings of which the following is a brief description.

DESCRIPTION OF THE PREFERRED EMBODIMENT

Figure 1:
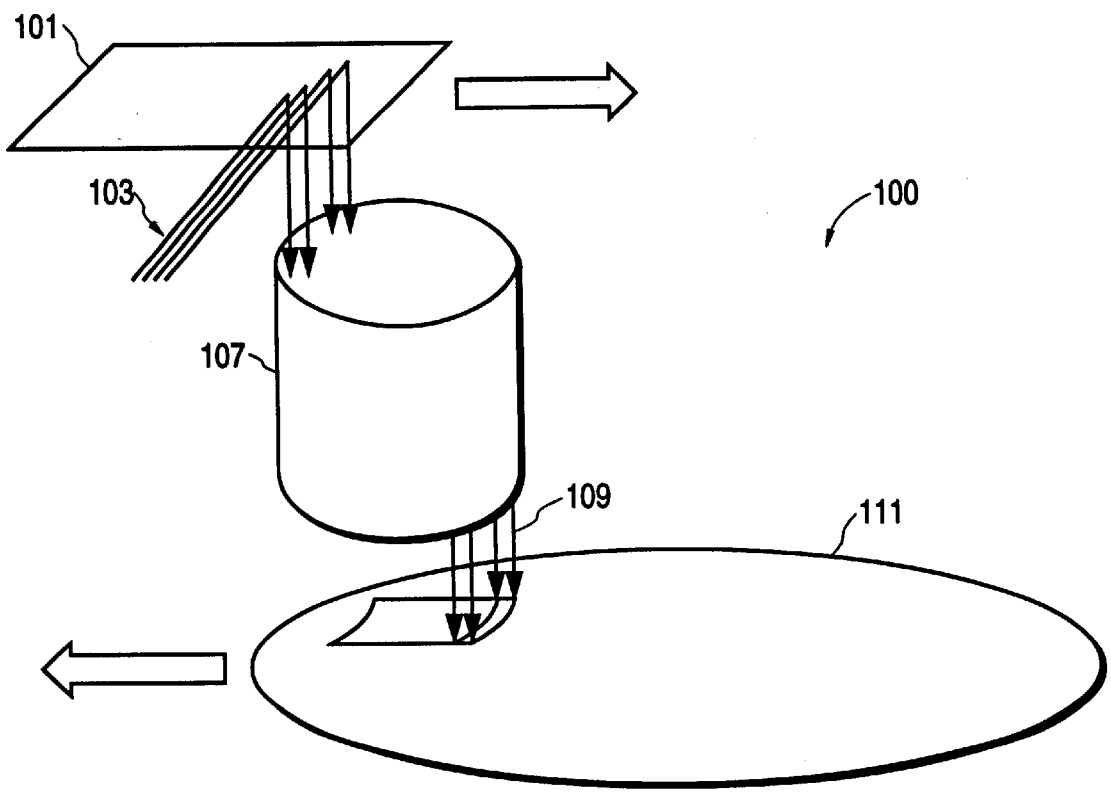
FIG. 1 is a view of a prior art ring field lithography system.

The following is a detailed description of the presently preferred embodiments of the present invention. However, the present invention is in no way intended to be limited to the embodiments discussed below or shown in the drawings. Rather, the description and the drawings are merely illustrative of the presently preferred embodiments of the invention.

Figure 4:
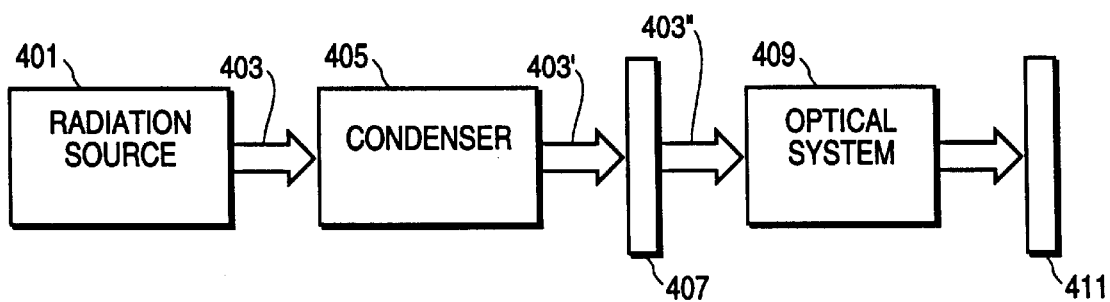
FIG. 4 is a schematic depiction of the main elements of the exemplary EUV lithography apparatus according to the present invention.

The present invention is a photolithography optical system designed for use with extreme ultraviolet (EUV) radiation. FIG. 4 schematically depicts the exemplary inventive apparatus for semiconductor EUV lithography. The apparatus comprises a radiation source 401 that emits EUV radiation 403. The EUV radiation 403 is processed by a condenser 405 which produces a EUV beam 403' to uniformly illuminate a portion of mask 407. The radiation reflected or transmitted from the mask 407 produces a patterned EUV beam 403'' which is introduced into optical system 409. The optical system 409 projects a reduced image of the mask 407 onto a wafer 411.

EUV radiation has a wavelength ($\lambda$) between about 4 to 20 nm and may be produced by any suitable means including laser produced plasma, synchrotron radiation, electric discharge sources, high-harmonic generation with femtosecond laser pulses, discharge-pumped x-ray lasers and electron-beam driven radiation devices. Laser-produced plasma (LPP) sources focus an intense pulsed laser beam onto a target. Suitable targets are metals and noble gases. Targets of noble gas molecule dusters in a supersonic jet produce a bright "spark" with a broad emission spectrum from the visible to the EUV radiation. An LLP xenon gas source converts about 0.8% of the incident laser power into EUV light in the required spectral bandwidth. High-repetition-rate (3,000–6,000 Hz) pulsed laser drivers deliver 1,500 W of focused power to the target regions. Other suitable targets include gold, tantalum, tungsten and copper.

The condenser collects EUV power from the LLP source and conditions the radiation to uniformly illuminate the mask. The condenser provides the EUV radiation in a narrow ring field with at least 1% uniformity at the mask in the cross scan dimension. The condenser further directs the EUV beam into the entrance pupil of the inventive optical system with a partial coherence of approximately 0.7. Separate collection channels each act in parallel directing radiation across the entire ring field and the optical system entrance pupil.

Since EUV radiation is absorbed by all materials, only reflective elements are suitable for EUV optical systems. The inventive optical system comprises four reflective optical elements listed in order from mask to substrate: M1, M2, M3 and M4. The optical system is placed in a vacuum or other suitable atmosphere.

Figure 5:
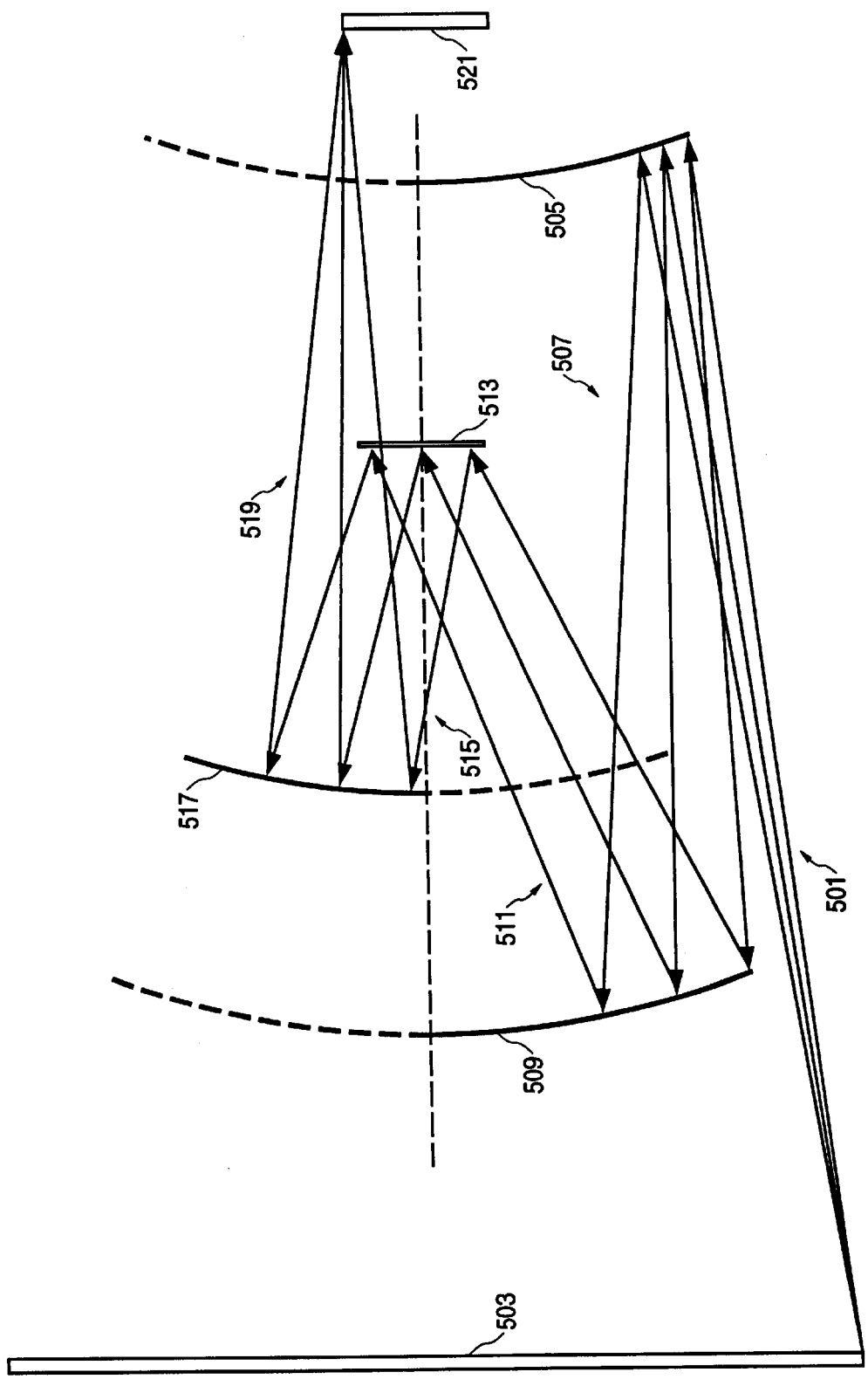
FIG. 5 is a view of the optical system according to the present invention.

During lithography, EUV rays are collimated and directed at a mask, producing patterned radiation. The object end of the inventive optical system departs enough from telecentricity so that a reflective mask can be used without any vignetting of the light rays by mirror edges. Referring to FIG. 5, there is shown an exemplary optical system for EUV semiconductor lithography. Because this is a ring field optical configuration, only the lower section of the first optical element M1 505, the lower section of the second optical element M2 509, all of the third optical element M3 513, and the upper section of the fourth optical element M4 517 are exposed to EUV radiation. The optical elements are all arranged in a coaxial configuration. The portions of the mirrors actually used are designated with solid lines and the virtual nonexistent portions are designated with dotted lines.

Beam1 501 diverges from mask 503 onto convex aspheric mirror M1 505. The mask 503 is reflective. Beam2 507 is reflected from mirror M1 505 in a divergent cone to a concave aspheric mirror M2 509. Beam3 511 is reflected from mirror M2 509 in a convergent cone to a convex spherical mirror M3 513, which also functions as an aperture stop. Beam4 515 is reflected from mirror M3 513 in a divergent cone to a concave aspheric mirror M4 517. Beam5 519 is reflected from mirror M4 517 in a convergent cone, projecting a reduced image of the mask 503 pattern onto a wafer 521. The chemical reaction of a photoresist layer on the wafer 521 to the patterned EUV exposure enables subsequent semiconductor processing by well known means.

Concave mirrors have positive optical power and convex mirrors have negative optical power. Using this convention, the optical power configuration of the inventive system from object to image can be described as: negative, positive, negative and positive, corresponding to mirrors M1 505, M2 509, M3 513 and M4 517, respectively. The relative positions of the mirrors M1 505, M2 509, M3 513, and M4 517 are listed in Table 2 below. For a four to one reduction, the distance of the mask to M1 505 is 744.35.

TABLE 2

| Surface | Axial separations of the mirrors as a fraction of the system focal length ± 10% |
|---|---|
| M1 to M2 | 1.121 |
| M2 to M3 | 0.897 |
| M3 to M4 | 0.460 |
| M4 to image | 0.825 |

Although some of the radiation incident to the optical elements is reflected, a large percentage of the incident radiation is absorbed. The total reflectivity of a four mirror optical system is described by the formula: $R_{total}=R_1 \times R_2 \times R_3 \times R_4$, where $R_x$ represents the reflectivity of Mirror$_x$. Different reflective coatings have different reflectivities. Reflective coatings, which have been found to have acceptable EUV reflectivity, include multilayered coatings of molybdenum/silicon (Mo/Si) and molybdenum/beryllium (Mo/Be). The maximum theoretical reflectivity of a multilayer mirror made of Mo/Si is approximately 72%.

The Mo/Si multilayer structure includes an alternating layer stack of Mo and Si. The Mo and Si layers are deposited in a dc-magnetron sputtering system or an ion beam sputtering system. The thickness of each layer was determined by simultaneously maximizing the constructive interference of the beams reflected at each interface and minimizing the overall absorption to enable more interfaces to contribute to the reflectance.

In addition to being highly reflective, the optical elements must have extremely accurate surface figures and surface roughness. State-of-the-art techniques are used to fabricate mirror surface figures with an accuracy of about 0.25 nm rms or better. Interferometers are used to measure the dimensional accuracy of the figure of the aspheric mirrors and the wavefront of assembled projection. Commercially available tools are capable of measuring surface roughness.

Although suitable reflective surfaces exist for EUV radiation, the wavelength must be kept within a tight tolerance to maintain acceptable reflectivity. The described reflectivity varies with the wavelength of the radiation.

Figure 6:
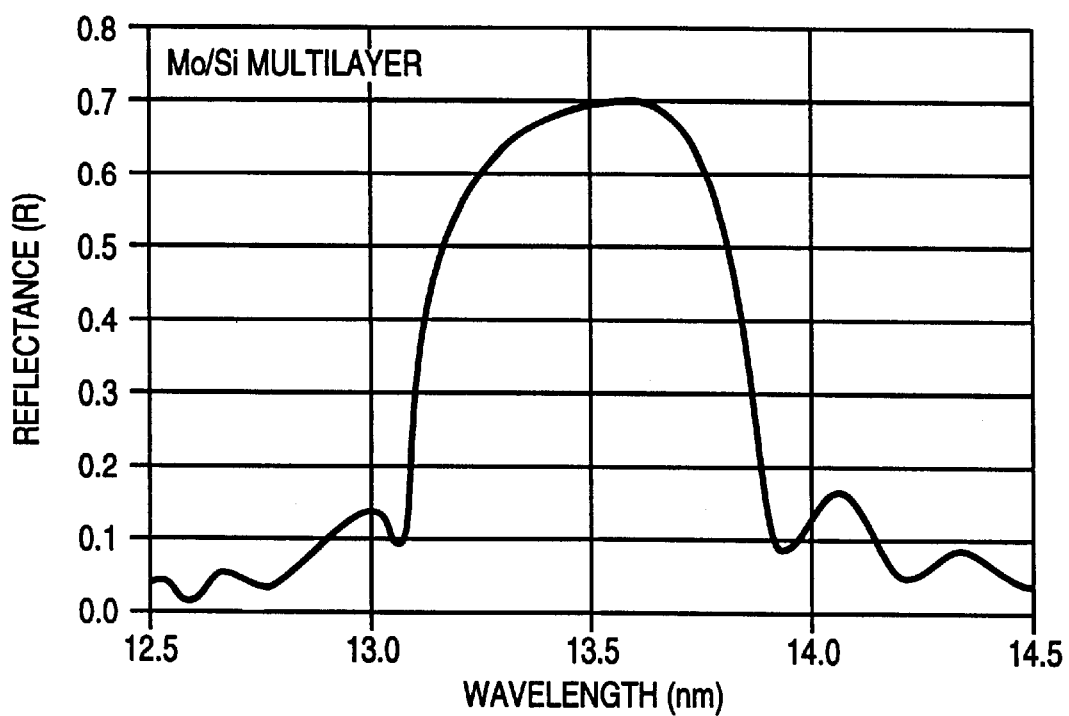
FIG. 6 is a graph showing reflectivity v. wavelength.

Referring to FIG. 6, a plot of the theoretical reflectivity versus wavelength at normal incidence is shown for a 40 bilayer Mo/Si multilayer. The maximum theoretical reflectivity of approximately 72% is achieved when the radiation wavelength is 13.4 nm; however, a deviation of 0.4 nm in the radiation wavelength results in reflectivity of a mere 12%.

Shifts in radiation wavelength are equivalent to changes in the incidence angle, i.e., both result in reduced reflectivity. The inventive optical system maintains a high overall system reflectivity by utilizing shallow incidence angles which are within the highly reflective region of the multilayer surface. The thickness of the layer coatings can be adjusted to maximize the reflectivity for specific range of incidence angles.

Figure 7A:
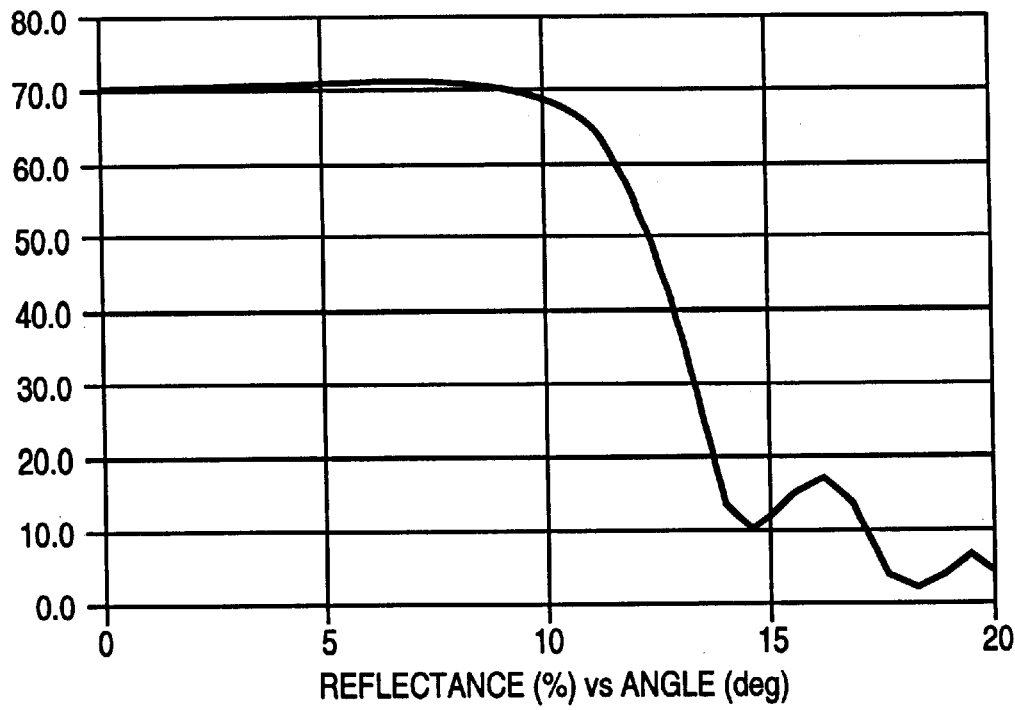
FIG. 7a is a graph showing reflectivity v. angle of incidence for a low incidence angle reflective Mo/Si coating.

Referring to FIG. 7a, the maximum theoretical reflectivity of over 70% for a suitably constructed Mo/Si multilayer optical element is obtained when the radiation incidence angle is 5°±5. For these low incidence angles, a bilayer pair is constructed using a 2.8 nm thick layer Mo and 4.0 nm thick layer of Si. The reflectivity of this multilayer coating decreases as the incidence angle varies. At incidence angles of 12.5° and 15°, the decreased reflectivity is about 40% and 12%, respectively. Keeping the incidence angles low at M1, M2, and M4 maximizes the system reflectivity by ensuring that the multilayer is being used at its highest reflectivity at all times.

Figure 7B:
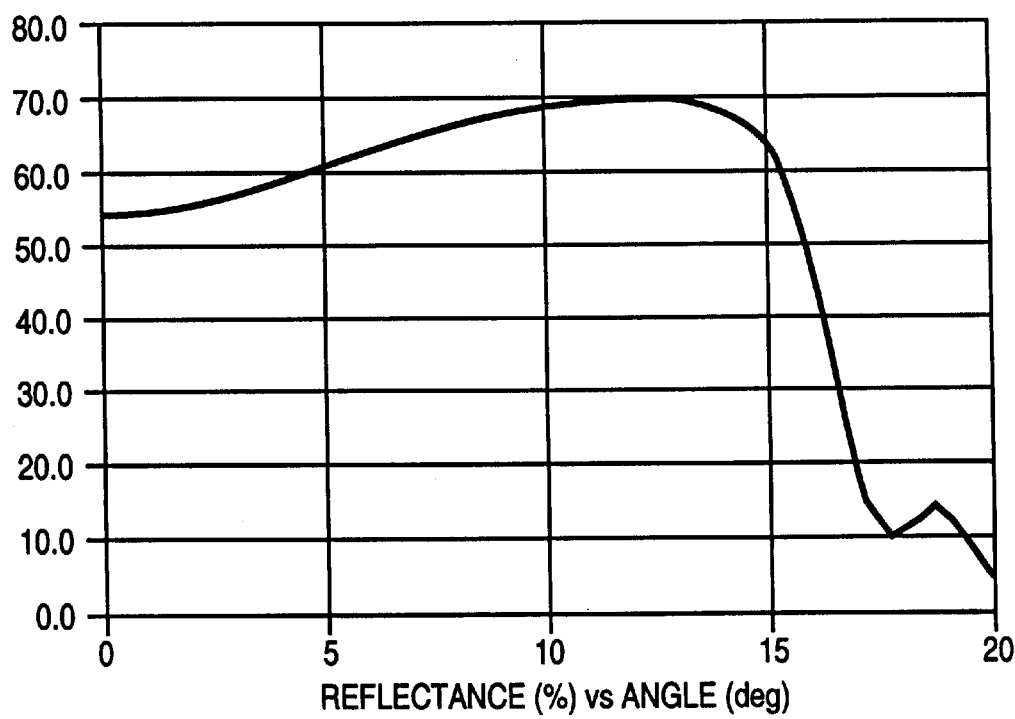
FIG. 7b is a graph showing reflectivity v. angle of incidence for a high incidence angle reflective Mo/Si coating.

Referring to FIG. 7b, the maximum theoretical reflectivity of over 70% can be shifted to higher incidence angle at the expense of the angular bandwidth of the coating. At the reflectance peak, the Mo/Si multilayer is shifted to about 12°±1. For these higher incidence angles, the Mo/Si bilayer is now composed of 2.92 nm thick layer of Mo and 4.12 nm thick layer of Si. Again, 40 bilayer pairs complete the multilayer stack. The reflectivity of this multilayer coating decreases more rapidly as the incidence angle deviates from 12°±1. At incidence angles of 0° and 17°, the decreased reflectivities are approximately 55% and 40%, respectively. The reflectivity M3 is maximized by using reflective optics specifically designed for incidence angles between approximately 11° and 13°.

In Table 3, the mean angle of incidence, the angle of incidence range and the corresponding reflectivity are listed for the optical elements of the present invention.

TABLE 3

| Optical Element | Mean Angle of Incidence | Angle of Incidence Range | Reflectivity Range |
| --- | --- | --- | --- |
| M1 | 3.48 | 3.8 | 70–71% |
| M2 | 6.56 | 0.8 | 71% |
| M3 | 12.0 | 1.6 | 70% |
| M4 | 6.0 | 1.4 | 70.5–71% |

Another benefit of the inventive optical system configuration is that the intensity of the illumination in the imaging bundle is uniform without the use of complex graded multilayer coatings. Prior art optical systems may require graded multilayer coatings to achieve this same level of illumination uniformity.

Another benefit of the inventive optical system is the minimization of high radiation intensity and heat generation which can degrade the reflective coating and cause thermal distortion of the optical element. Because the inventive system has a high total reflectivity, the absorbed energy is minimized. The inventive system is also able to dissipate the absorbed energy more readily because mirror M1 has a large surface area. By spreading the radiation energy across a broader surface area, the radiation intensity and resulting heat generation are minimized.

The inventive optical system requires only low aspheric mirrors, which are significantly easier to test and fabricate than highly aspheric mirrors. Mirrors with asphercities less than approximately 10 micrometers (low asphericity) can be tested at the center of curvature without the need for complex auxiliary test optics. In addition, low asphericity mirrors are more easily polished to an excellent surface finish of less than one angstrom. Table 4 below shows the maximum aspheric departure from a best-fit spherical surface centered on the off-axis section of the parent asphere for each mirror.

TABLE 4

| M1 | ±2.2 $\mu$m |
| --- | --- |
| M2 | ±4.2 $\mu$m |
| M3 | 0 |
| M4 | ±1.0 $\mu$m |

Yet another advantage of the inventive optical system is that the design has an accessible, real aperture stop on mirror M3. The accessible aperture stop makes the projected imagery stationary. The imagery is independent of the position of the ring field width. More specifically, the accessible aperture stop ensures that imaging bundles from each field point are not clipped or vignetted across the ring field width. The inventive optical system utilizes a fold mirror M3 as the aperture stop. M3 is configured with at least 5 mm of clearance around its diameter from other radiation beams making it accessible for adjustment.

The inventive optical system arcuate slit 201 dimensions are an improvement over the prior art. The prior art typically produced an arcuate slit 201 with length 207 (approximately 16 mm) at an angle 209 (approximately 60°), a ring field width 205 (approximately 0.5 mm to 1.0 mm) and a ring field radius 203 (approximately 31.5 mm). The ring field width 205 of the present invention (1.5 mm) is significantly wider than that of the prior art. Because the nng field radius 203 of the present invention is larger than that of the prior art, the present invention improves the unit area coverage within a single field on the wafer, thereby improving wafer throughput per hour.

Table 5 shows the performance of the system as described by the wavefront error.

TABLE 5

| Ringfield Radius | rms wavefront error | Strehl ratio |
| --- | --- | --- |
| 52.00 mm | 0.024 | 0.98 |
| 52.75 mm | 0.014 | 0.99 |
| 53.50 mm | 0.024 | 0.98 |

Tables 6 to 8 contain constructional data and other relevant information for the currently preferred configuration of mirrors M1, M2, M3 and M4. The inventive optical system has a 4:1 reduction ratio, a numerical aperture of 0.1, and a 1.5 mm ring field width that is capable of 0.1 $\mu$m resolution and 1.0 $\mu$m depth of focus. The optical elements M1, M2, M3 and M4 can be described via the base optic as hyperboloid, prolate ellipse, sphere, and oblate ellipse, respectively. Table 6 below describes the mirror surfaces of the inventive optical system.

TABLE 6

| Surface | Radius | Thickness | | |
|---|---|---|---|---|
| 0 | — | 3022.63240 | AIR | mask |
| 1 | — | −1805.00000 | AIR | entrance pupil |
| 2 | 7209.80000 | −687.87712 | REFLECT | M1 |
| 3 | 1254.00000 | 511.93030 | REFLECT | M2 |
| 4 | 396.47273 | −266.70187 | REFLECT | M3 |
| 5 | 536.32695 | 493.652606 | REFLECT | M4 |
| 6 | — | — | — | wafer |

The aspheric parameters for the optical elements M1, M2, and M4 are listed in Table 7 below.

TABLE 7

| Surface | Conic Constant (CC) | AD | AE | AF | AG |
|---|---|---|---|---|---|
| 2 (M1) | — | $-5.8979 \times 10^{-11}$ | $-7.6601 \times 10^{-16}$ | $2.2465 \times 10^{-20}$ | $-3.0192 \times 10^{-25}$ |
| 3 (M2) | −1.157332 | — | $-1.3838 \times 10^{-16}$ | $2.6899 \times 10^{-21}$ | $-5.5472 \times 10^{-26}$ |
| 5 (M4) | 0.11600 | — | $2.6900 \times 10^{-16}$ | $-1.7417 \times 10^{-20}$ | $6.5082 \times 10^{-25}$ |

TABLE 8

| Surface | Mirror radii from object plane to image plane as a fraction of the system focal length ± 5% |
|---|---|
| M1 | 5.46 |
| M2 | 1.982 |
| M3 | 0.712 |
| M4 | 0.925 |

While the present invention has been described in terms of a preferred embodiment above, those skilled in the art will readily appreciate that numerous modifications, substitutions and additions may be made to the disclosed embodiment without departing from the spirit and scope of the present invention. For example, although an optical system has been described above for use with a semiconductor photolithography system, those skilled in the art will readily appreciate that the inventive optical system may be utilized in any similar lithography device and that the present invention is in no way limited to the mechanisms described above.

Figure 2:
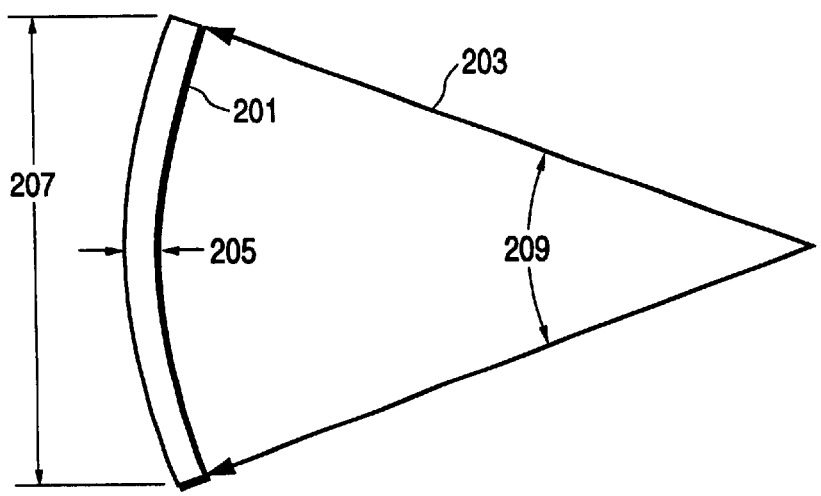
FIG. 2 is a view of a ring field slit.
Figure 3:
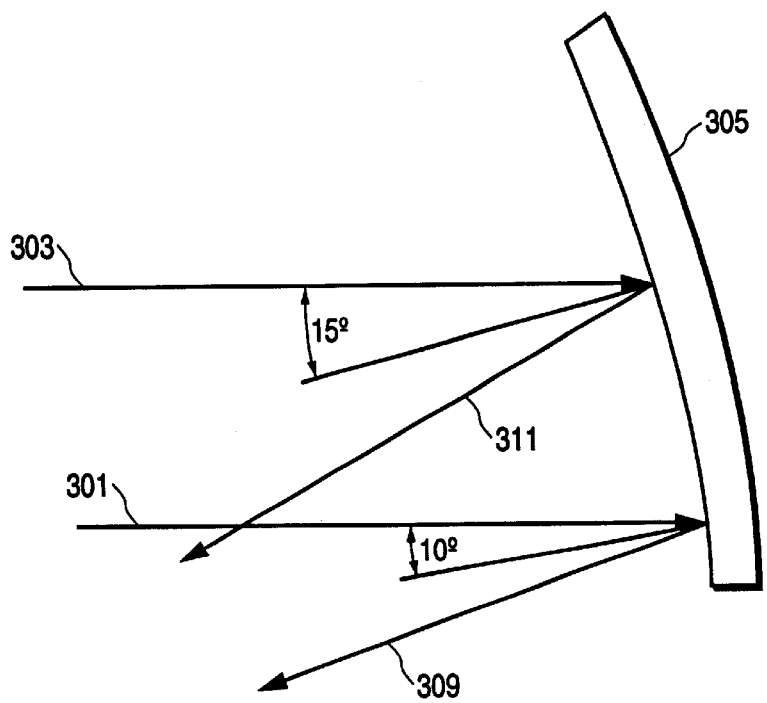
FIG. 3 is a view of two radiation beams incident upon a reflective element.

Similarly, the skilled artisan will readily appreciate that the optical system shown in FIG. 2 is in no way limited to use with a particular type of lithography system or a particular lithography machine. Those skilled in the art will also readily appreciate that the optical system may be used with any similar lithography mechanism. It is intended that all such modifications, substitutions and additions fall within the scope of the present invention which is best defined by the claims below.

What is claimed is:

1. A method of projecting a mask image onto a substrate using a scanning ringfield lithography apparatus, comprising producing extreme ultraviolet radiation of wavelengths ranging from approximately 4 to 20 nanometers;

condensing the radiation and directing it generally in one direction toward a mask image;

patterning the condensed radiation with the mask;

reducing the patterned radiation with reflective focusing optics comprising four reflective elements which viewed from object to image are characterized as convex, concave, convex and concave;

projecting a focused image on the substrate in the shape of an arcuate slit having a constant radius of curvature between approximately 30 mm and 70 mm and of a width between approximately 1.0 mm and 3.0 mm; and exposing a substrate coated with a photoresist layer to the reduced patterned radiation.

2. The method of claim 1, further comprising providing at least three of the four reflective elements of the reflective focusing optics having rotationally symmetric aspheric surfaces.

3. The method of claim 1, wherein the first reflective element deviates from the best fitting spherical surface by about 2.2 μm±2 μm, the second reflective element deviates from the best fitting spherical surface by about 4.2 μm ±3 μm, and the fourth reflective element deviates from the best fitting spherical surface by about 1.0 μm±2 μm.

4. The method of claim 1, wherein each optical element of the reflective focusing optics has a reflective multilayer coating in which each layer has a substantially uniform thickness.

5. The method of claim 1, further comprising providing the reflective focusing optics such that a beam of the extreme ultraviolet radiation has a mean incidence angle upon the first reflective element of about 3.5°±10°, a mean incidence angle upon the second reflective element of about 6.6°±10°, a mean incidence angle upon the third reflective element of about 12°±10° and a mean incidence angle upon the fourth reflective element of about 6.0°±10°.

6. The method of claim 1, further comprising providing the reflective focusing optics such that the reflective optical elements are coaxial with respect to each other.

7. The method of claim 1, further comprising providing the reflective focusing optics such that a beam of the extreme ultraviolet radiation passing through the reflective focusing optics is telecentric at the substrate plane.

8. The method of claim 1, further comprising providing an aperture stop accessibly located at or near the third reflective element.

9. The method of claim 1, further comprising providing the reflective focusing optics such that each reflective optical element has a reflective multilayer coating in which each layer has a substantially uniform thickness.

* * * * *